United States Patent [19]
Hehmann

[11] Patent Number: 6,077,449
[45] Date of Patent: Jun. 20, 2000

[54] METHOD OF CHECKING THE ACCURACY OF THE RESULT OF A MULTISTEP ETCHING PROCESS

[75] Inventor: Jörg Hehmann, Nürnberg, Germany

[73] Assignee: Alcatel, Paris, France

[21] Appl. No.: 08/991,673

[22] Filed: Dec. 16, 1997

[30] Foreign Application Priority Data

Dec. 19, 1996 [DE] Germany .......................... 196 52 974

[51] Int. Cl.[7] .............................. C23F 1/00; G01B 11/14
[52] U.S. Cl. .............................. 216/59; 216/84; 356/373; 356/375
[58] Field of Search ................................. 216/2, 41, 51, 216/59, 84; 356/373, 375

[56] References Cited

U.S. PATENT DOCUMENTS

| | | | |
|---|---|---|---|
| 4,529,314 | 7/1985 | Ports | 356/375 |
| 5,017,514 | 5/1991 | Nishimoto | 437/229 |
| 5,470,782 | 11/1995 | Schwalke et al. | 437/70 |
| 5,766,809 | 6/1998 | Bae | 430/22 |

FOREIGN PATENT DOCUMENTS

| | | |
|---|---|---|
| 0656651 | 6/1995 | European Pat. Off. . |
| 0152365 | 11/1981 | Germany . |

OTHER PUBLICATIONS

"MEMS: Small machines for the microelectronics age" by Koester, et al. MCNC MEMS Technology Applications Center, Jan. 1996, pp. 93–94. XP–000749841.

Geiser, Ralph, "Reticle Production", In: The Instrument Maker, Jul./Aug. 1948 pp. 4, 6–8, 12.

*Primary Examiner*—Christine Skane

[57] ABSTRACT

A method is disclosed for checking the accuracy of the result of a multistep etching process for forming depressions in a substrate. The check is made possible in a simple manner by providing line patterns on the etch masks. The line patterns on the etch masks for different etching steps are different and form a vernier system.

1 Claim, 2 Drawing Sheets

Structures in Mask Nbr 1 | Structures in Mask Nbr 2

Structures in Mask Nbr 1 | Structures in Mask Nbr 2

METHOD OF CHECKING THE ACCURACY OF THE RESULT OF A MULTISTEP ETCHING PROCESS

TECHNICAL FIELD

This invention relates to a method of checking the accuracy of the result of a multistep etching process for forming depressions in a substrate.

BACKGROUND OF THE INVENTION

Components which have high-precision micropatterns are produced by etching. This involves providing them with etch masks using a photolithographic technique. If the micropatterns are complex, i.e., if they have different depths, and are additionally interleaved, two or more etching operations have to be performed.

Since the results of the different etching operations must be precisely positioned relative to each other, it is necessary to accurately align the different etch masks with one another, for which suitable apparatus is available. It is also necessary to be able to check the result of the multistep etching process for accuracy after completion of the micropattern.

SUMMARY OF THE INVENTION

The technical problem to be solved by the invention is to provide a means whereby it is possible to check in a simple manner whether the high-precision micropattern has the required accuracy after the multistep etching process.

According to the invention, a line pattern is provided on the etch masks, and the line patterns on the etch masks for different etching steps differ in such a way as to form a vernier system.

In applying this solution, a line pattern from which any deviation and its magnitude can be read directly is etched on the etched substrate.

BRIEF DESCRIPTION OF THE DRAWINGS

The invention will now be explained with reference to an embodiment shown in the accompanying drawings for a two-step etching process. In the drawings.

BEST MODE FOR CARRYING OUT THE INVENTION

Figure 1:
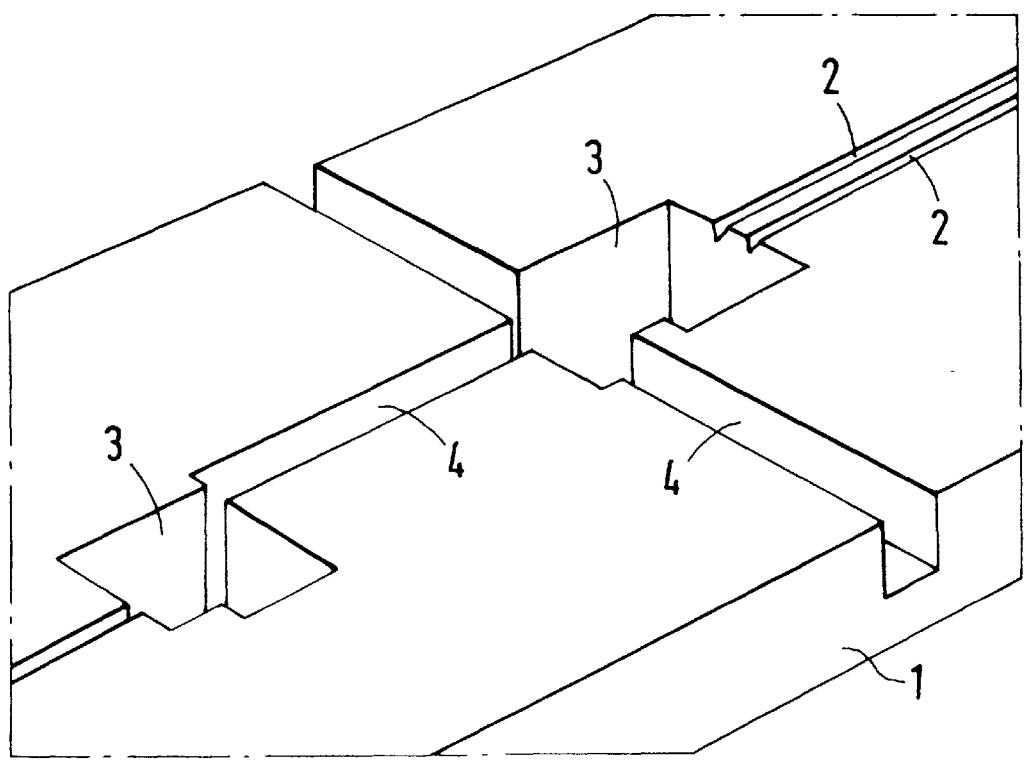
FIG. 1 shows a part of a substrate formed by a two-step etching process.

FIG. 1 shows a part of a substrate 1 in which depressions of different shapes and different depths were formed by etching. Relatively shallow grooves 2, boxlike depressions 3, and moats 4 are shown. Such substrates are used, for example, as microoptic benches in the manufacture of optoelectronic components. In such an application, the substrate is of silicon. However, the invention can also be used in the fabrication of other objects by multistep etching in order to check the quality imparted to the objects in the etching process. As is well known, a multitude of precision components are fabricated by contour etching (chemical machining).

Figure 2:
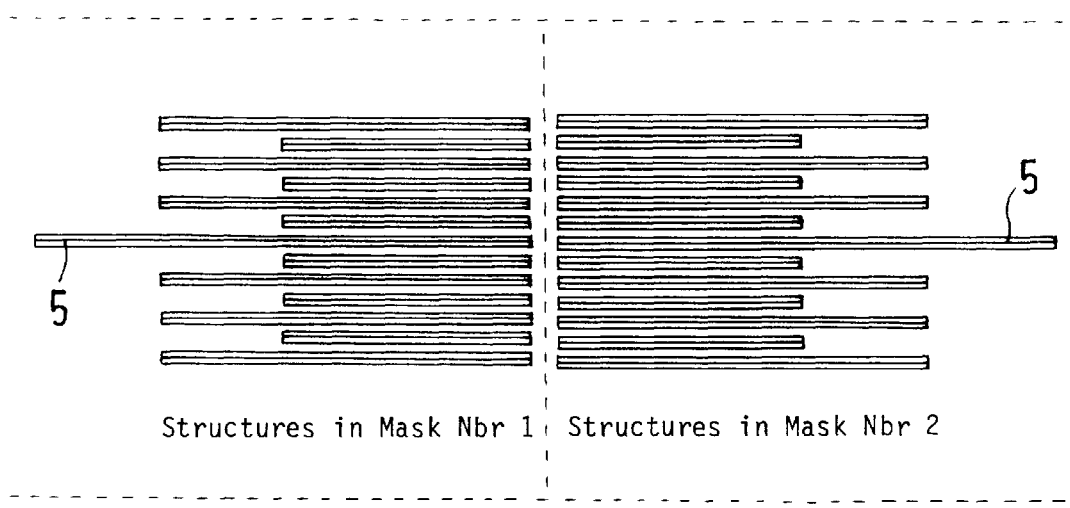
FIG. 2 shows the line patterns used on the two etch masks.

FIG. 2 shows the line patterns of two etch masks as are used in a two-step etching process. The left-hand line pattern is intended for the mask for the first etching operation; the center-to-center distance between the lines is a. The right-hand line pattern is intended for the mask for the second etching operation; the center-to-center distance between the lines is a+x, e.g., a+0.5 $\mu$m.

As can be seen from FIG. 2, the long lines 5 of the two line patterns are in alignment. If that were also true for the etched line pattern on the substrate, there would be no deviation between the two etching operations. If, however, two medium-long or short etched line patterns are in alignment on the substrate, the results of the two etching operations differ by 0.5 $\mu$m or a multiple thereof.

In the embodiment shown, the lines of the line pattern are separated by a distance of 40 $\mu$m (1st mask) or 40.5 $\mu$m (2nd mask). The line width is 20 $\mu$m, and the line lengths are 50.75 and 100 $\mu$m.

Figure 3:
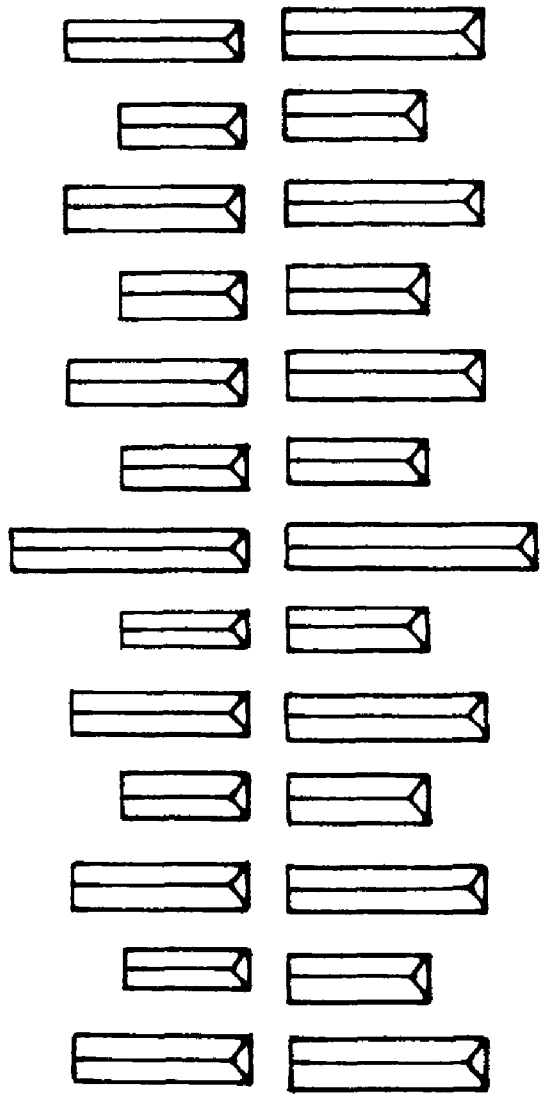
FIG. 3 shows the etched line patterns produced on the substrate using the etch masks.

FIG. 3 shows the etched line patterns on the substrate.

What is claimed is:

1. A method of checking the accuracy of the result of a multistep etching process which uses opposing etched patterns for forming depressions in a substrate, characterized in that a line pattern is provided on at least two etch masks, and that the line patterns on the etch masks for different etching steps differ to form a vernier system wherein the line patterns each include one longer line, and multiple shorter lines of the same length, and multiple shortest lines of the same length, so that alignment of resultant opposing etched patterns on the substrate is determined by the following steps:

viewing whether the longest lines of the opposing etched patterns on the substrate are in alignment which indicates that alignment between the etching steps is present in the substrate, viewing whether the shorter or shortest lines of the opposing etched patterns are in alignment which indicates that the etching steps are misaligned by a multiple of a difference distance (x) between the lines of the etch masks.

* * * * *